(12) United States Patent
Tran et al.

(10) Patent No.: US 6,937,047 B2
(45) Date of Patent: Aug. 30, 2005

(54) INTEGRATED CIRCUIT WITH TEST PAD STRUCTURE AND METHOD OF TESTING

(75) Inventors: Tu-Anh Tran, Austin, TX (US); Richard K. Eguchi, Austin, TX (US); Peter R. Harper, Round Rock, TX (US); Chu-Chung Lee, Round Rock, TX (US); William M. Williams, Gilbert, AZ (US); Lois Yong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 10/634,484

(22) Filed: Aug. 5, 2003

(65) Prior Publication Data

US 2005/0030055 A1 Feb. 10, 2005

(51) Int. Cl.[7] ............................................. G01R 31/02
(52) U.S. Cl. ........................................ 324/763; 324/765
(58) Field of Search ................................. 324/754–765, 324/158.1; 438/14–18, 467; 257/48

(56) References Cited

U.S. PATENT DOCUMENTS

| | | | |
|---|---|---|---|
| 5,399,505 A | 3/1995 | Dasse | |
| 5,554,940 A | 9/1996 | Hubacher | |
| 6,008,061 A * | 12/1999 | Kasai | 438/18 |
| 6,214,630 B1 * | 4/2001 | Hsuan et al. | 438/11 |
| 6,614,091 B1 | 9/2003 | Downey et al. | |
| 6,844,631 B2 | 1/2005 | Yong et al. | |

OTHER PUBLICATIONS

Related U.S. Appl. No. 10/304,416.

* cited by examiner

*Primary Examiner*—Vinh P. Nguyen
(74) *Attorney, Agent, or Firm*—James L. Clingan, Jr.; Michael Balconi-Lamica

(57) ABSTRACT

A semiconductor device has a large number of bond pads on the periphery for wirebonding. The semiconductor device has a module as well as other circuitry, but the module takes significantly longer to test than the other circuitry. A relatively small number of the bond pads, the module bond pads, are required for the module testing due, at least in part, to the semiconductor device having a built-in self-test (BIST) circuitry. The functionality of these module bond pads is duplicated on the top surface of and in the interior of the semiconductor device with module test pads that are significantly larger than the bond pads on the periphery. Having large pads for testing allows longer probe needles, thus increasing parallel testing capability. Duplicating the functionality is achieved through a test pad interface so that the module bond pads and the module test pads do not have to be shorted together.

38 Claims, 4 Drawing Sheets

US 6,937,047 B2

INTEGRATED CIRCUIT WITH TEST PAD STRUCTURE AND METHOD OF TESTING

RELATED APPLICATIONS

This application is related to U.S. patent application Ser. No. 10/097,036 filed Mar. 13, 2002, entitled "Semiconductor Device Having a Bond Pad and Method Therefor" and assigned to the current assignee hereof. This application is also related to U.S. patent application Ser. No. 10/304,416 filed Nov. 26, 2002, as a continuation-in-part of application Ser. No. 10/097,036, filed Mar. 13, 2002, entitled "Semiconductor Device Having a Bond Pad and Method Therefor," and assigned to the current assignee hereof. This application is further related to U.S. patent application Ser. No. 10/097,059 filed Mar. 13, 2002, entitled "Semiconductor Device Having a Wire Bond Pad and Method Therefor" and assigned to the current assignee hereof.

FIELD OF THE INVENTION

This invention relates to packaged integrated circuits, and more particularly, to integrated circuits that are for wirebonding and have a functional block for testing.

RELATED ART

In integrated circuit manufacturing, wire bonding is a well proven method used to connect a semiconductor die having electrical circuitry to a pin on a component package. Within integrated circuit manufacturing it is also a common practice to test the functionality of the semiconductor die before completing component assembly. "Probe test" is one such method used to test a semiconductor where a probe contact is commonly used as a mechanical and electrical interface to bond pads on the die.

Testing, including test probe testing, can be significant in the amount of time required to perform the testing. It is desirable to minimize this test time. One way that test time can be reduced is to test multiple die on the wafer at the same time. This parallel testing of die is beneficial but is made more difficult by the decreasing bond pad geometries characteristic of modern deep sub-micron semiconductor technology. Decreasing bond pad geometries include smaller bond pads on which smaller wire bonds are formed and also reducing the distance that the bond pads are apart. The distance between centers of bond pads is called pitch. As the pitch and bond pad size have decreased with technological advances, the challenge for robust parallel probe testing has increased. Smaller bond pads required smaller probe tip needles, which pose both probe card fabrication and maintenance challenges. With the desire of parallel probe testing, the length of the cantilevered probe needles has increased, which makes precisely locating the bond pads more difficult. It is more challenging to maintain coplanarity among many long and small probe needles and maintain good electrical contact with the bond pads. Thus, the move toward smaller bond pads and the move toward longer probe needles has combined to multiply the difficulty of properly placing the probe needles on the bond pads. To overcome this difficulty, one technique that has been developed is to utilize vertical probing technology which is more expensive technology that cantilevered probe technology.

Thus, there is a benefit for the ability to increase the number of die being tested by parallel testing in the face of ever smaller bond pads at tighter pitch while still being able to properly place the probe needle to perform the needed testing, preferably without affecting die size significantly.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described herein an integrated circuit may have a plurality of functional blocks that can also be called modules. Exemplary modules include a non-volatile memory (NVM), a static random access memory (SRAM), a read only memory (ROM), and processing units. In one form of the invention, a module is tested by a combination of built-in self-test (BIST) circuitry and an external tester by utilizing module test pads in the middle of the die that are much larger than the bond pads on the periphery. In another form of the invention, large test pads in the middle of the die are designed to test multiple modules on the integrated circuit or test the entire integrated circuit. Only the pads necessary for testing the module are provided as module test pads. The module test pads are over the passivation layer and contact the underlying module circuitry through openings, typically to form vias, in the passivation layer. By extending the module test pads over the passivation layer, the size of the vias is not affected, and the size of the module test pads can be increased without increasing the overall size of the semiconductor device. With the test pads being large and at a coarse pitch, substantially low-cost probe technology, such as cantilever probe technology, can be utilized. Cantilevered probe needles can extend relatively large distances and still reliably make contact with the test pads, thus enabling parallel testing of multiple die while present on the semiconductor wafer. This is better understood with reference to the drawings and the following description.

Figure 1:
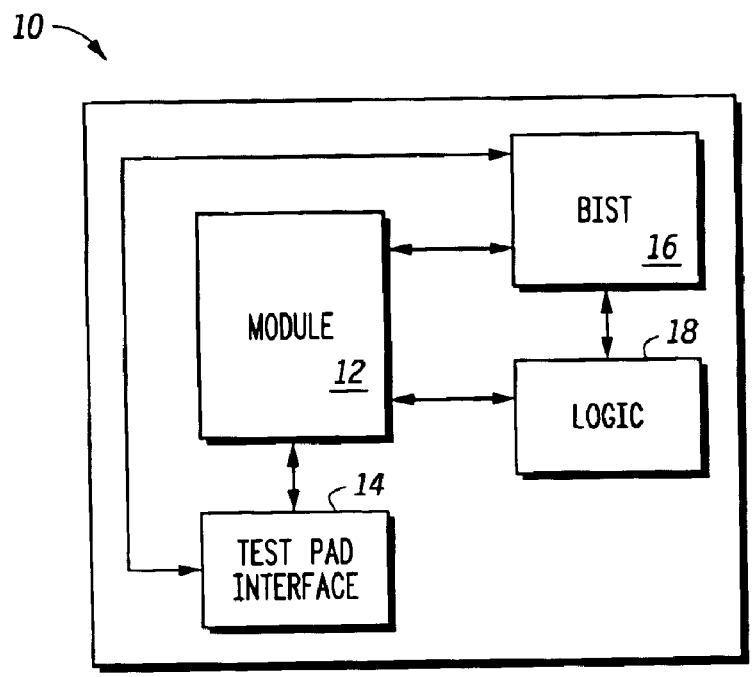
FIG. 1 is a functional block diagram of an integrated circuit according to an embodiment of the invention.

Shown in FIG. 1 is a semiconductor device 10 comprising a module 12, a test pad interface 14, a built-in self-test (BIST) circuit 16, and logic 18. This shows that these elements 12–18 of semiconductor device 10 are interconnected. Logic 18 preferably includes an arithmetic logic unit (ALU), as well as other control circuitry, that operates module 12. BIST 16 is for running performance tests on module 12 and logic 18. External test circuitry is also required for running tests on module 12. In this case, test pad interface 14 assists in coupling the module to the external test circuitry as shown in part in FIG. 2.

Figure 2:
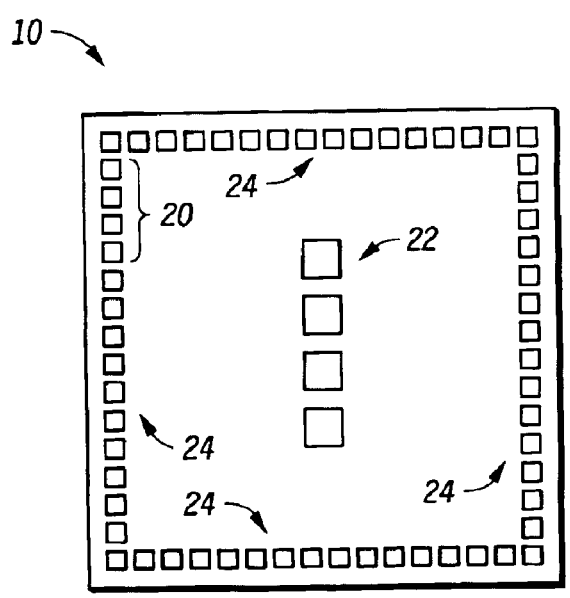
FIG. 2 is a simplified top view of the integrated circuit of FIG. 1.

Shown in FIG. 2 is a top view of semiconductor device 10 showing module bond pads 20 on the periphery, module test pads 22 in a row in the middle of the semiconductor device, and regular bond pads 24 on the periphery. Module 12 receives and generates signals, some of which are useful in testing module 12. These signals useful in testing are referred to as module test signals. These module test signals are brought out externally to bond pads 20 and, via test pad interface 14, to module test pads 22. In this case, the module test pads 22 are in a single row for the convenience of cantilevered probe needles commonly used in testing. Module test pads 22 are for the same functional signals as are bond pads 20. Module bond pads 20 are much smaller than module test pads 22. The module test pads may be square, as shown in FIG. 2, or some other shape. For example, the module test pads may be 100 by 200 microns and spaced apart with a 250 micron pitch when aligned in the short dimension. The bond pads similarly may be square or some other shape. For example, the bond pads may be 52 microns by 82 microns and spaced apart with a 55 micron pitch when aligned in the short dimension. Thus, in this example the top surface area of the module test pads is more than four times greater than the top surface area of the bond pads. This difference in dimensions of the bond pads 20 and 24, as compared to the module test pads 22, is very significant for the purpose of landing a probe needle on such pad. Optimizing size, pitch, and placement of the module test pads can ensure the use of the least expensive and most mature cantilever probe technology. Even if the test pad was only twice as large, there would be substantial benefit in ensuring that the cantilevered probe needles would land on the test pads.

In the example shown there are only four module test pads, but more would typically be needed. The number needed is a function of the module architecture, module type, and the manner in which the BIST 16 functions. In one example, a flash module of 2 megabytes requires 14 module test pads. This required number will vary with the type of BIST and module architecture as well as the particular type of module testing to be performed. The manner of determining the required number is known in module testing. The module testing of memories of this type of magnitude generally take much longer than testing for logic such as logic 18. Thus there is generally much more benefit in increasing parallel testing capability for memories. The function is thus that most of the signals are brought out only on the bond pads 24 on the periphery and the signals that are needed for performing the module test are brought out externally both on module bond pads 20 on the periphery and also on much larger module test pads 22 inside the periphery. The combination of a small number of module test pads and optimized size, pitch, and placement of the module test pads enable the increased level of parallel testing of semiconductor devices.

Figure 3:
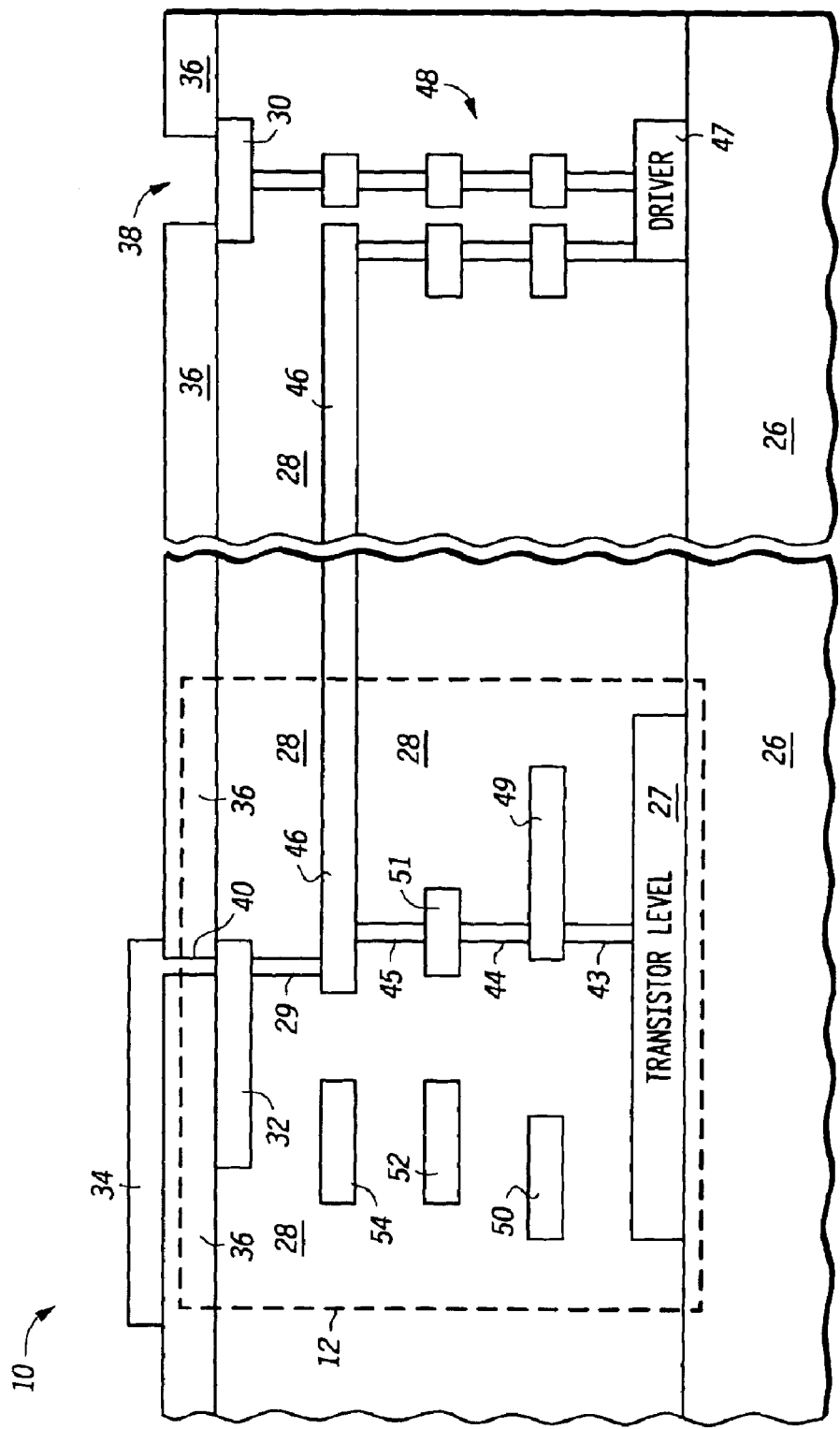
FIG. 3 is a cross section of a portion of the integrated circuit of FIG. 1.

Shown in FIG. 3 is semiconductor 10 in a cross section showing one option for test pad interface 14. Shown in FIG. 3 is module 12 formed in and over a semiconductor substrate 26, a test pad 34 that is one of module test bond pads 22 of FIG. 2, interconnecting layers region 28 above substrate 26 that is a combination of conductive layers and dielectric layers separating the conductive layers, a passivation layer 36 over interconnecting layers region 28, a bond pad 30 that is one of module bond pads 20 shown in FIG. 2, a driver 47 on and over substrate 26, an interconnect 48 connecting driver 47 to bond pad 30, an opening 38 that exposes bond pad 30, and a via 40. In interconnecting layers region 28 are four metal layers. Metal portions 49 and 50 are formed in a first metal layer, metal portions 51 and 52 are formed in a second metal layer, metal portions 46 and 54 are formed in a third metal layer, and portion 32 and module bond pad 30 are formed in a final metal layer that is the last metal layer before the passivation layer. These four metal layers are for providing interconnect. These are shown for illustration and there may be less or more metal interconnect layers in alternative semiconductor devices. For example, six metal layers may actually be used in a semiconductor device such as semiconductor device 10.

In the simplified example shown in FIG. 3, there is a module array of transistors at transistor level 27 having a functional signal that is routed through the first, second, and third metal layers between the transistor level 27 and module bond pad 30. Similarly, this functional signal is routed between module test pad 34 and transistor level 27 through the first, second, third, and final metal layers as well as through via 40. In this case via 40 is part of test pad interface 14. In this illustrated embodiment test pad 34 is preferably aluminum and final metal 32 is preferably copper. In such case, it is preferable that there be a barrier, such as tantalum, lining via 40 to provide an interface between the copper of final layer 32 and the aluminum of module test pad 34. In other embodiments, test pad 34, metal layers, final 32, and the barrier metal may be formed from other electrically conductive material. For example, test pad 34 may be fabricated from gold, and the metal layers and final metal 32 may include aluminum or gold. Also, the barrier metal may be any material for forming a diffusion barrier and adhesion layer between dissimilar and adjacent materials. Examples of such diffusion and barrier material are tantalum nitride, titanium, titanium nitride, nickel, tungsten, titanium tungsten alloy, and tantalum silicon nitride.

Thus, for example, if module test pad 34 and module bond pad 30 are being driven by transistor level 27, the functional signal provided at module test pad 34 and the functional signal provided at module bond pad 30 are functionally the same but are not identically the same, that is to say, they are not shorted together and the functionality of the pads is duplicated between the module bond pad 30 and the module test pad 34. Further, the test pads can be considered to be directly connected to the functional circuitry because the electrical connection from the test pads to the functional circuitry is not by way of the bond pads. The top area of the module test pad is mostly extended over the passivation layer, thus the size of the vias is not affected, and the size of the module test pads can be increased without increasing the overall size of the semiconductor device.

Figure 4:
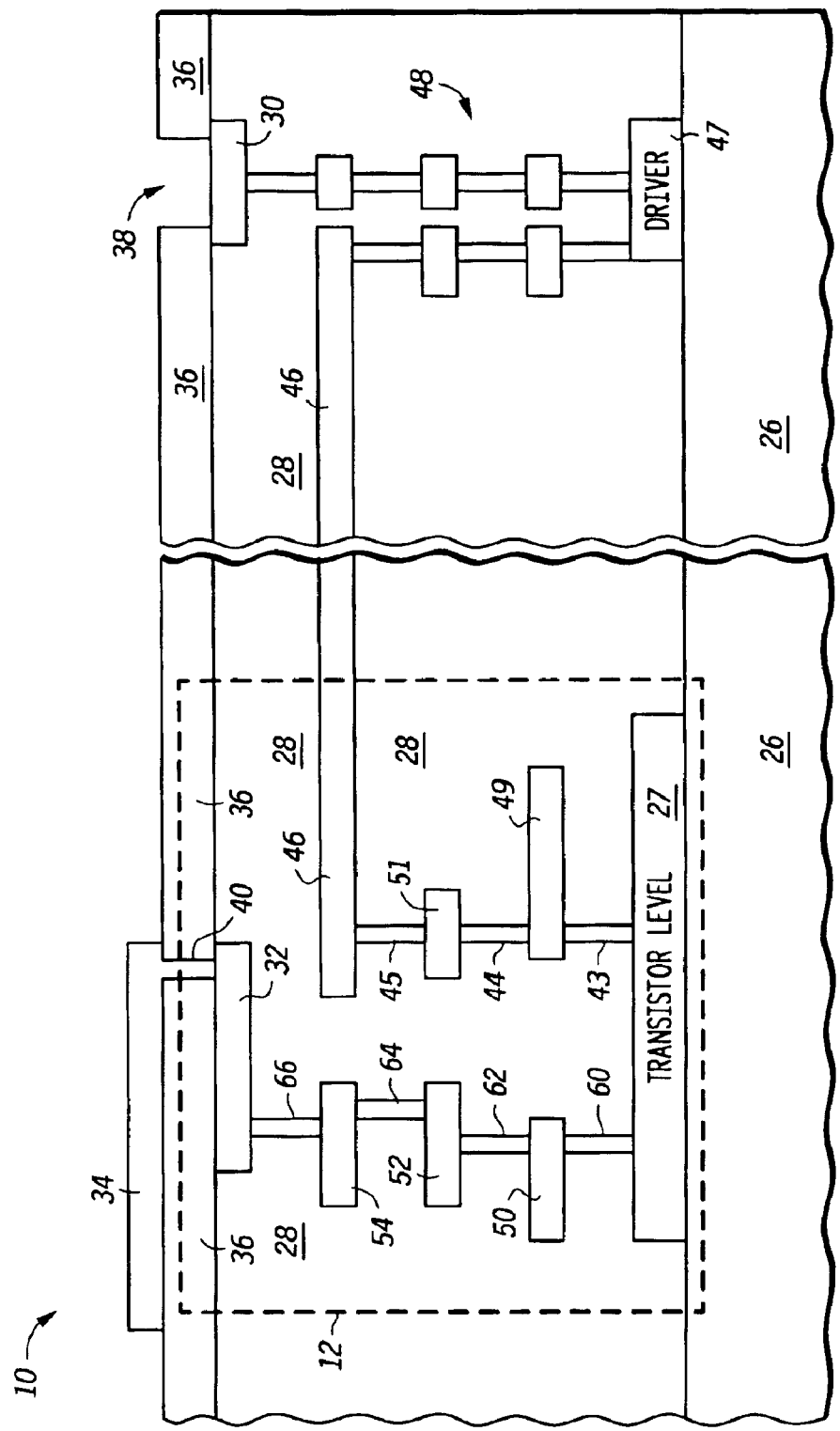
FIG. 4 is a cross section of an alternative portion of the packaged integrated circuit of FIG. 1.

An alternative for the type of test pad interface 14 used is shown in FIG. 4. The same reference numerals are retained for the same structural elements. In this case of FIG. 4, the functional signal is provided between transistor level 27 and module test pad 34 by a different route. In this case there is different circuitry at transistor level 27 for the connection point and there is a different route through the first, second and third metal layers. This type of situation is for the case, for example, in which some type of additional circuitry is needed for the functional signal at module test pad 34. This may take the form of, for example, electrostatic discharge (ESD) circuitry or buffering circuitry. The functional operation of the signals at module test pad 34 and module bond pad 30 would be the same but not identically the same signal. The additional circuitry may increase the size of the semiconductor device. Since the module test pads are exclusively used for testing and the next-level interconnection is not required, however, the ESD or driver circuitry for the module test pads is significantly less complex and smaller than that of the regular bond pads 24 and module bond pads 20 on the periphery shown in FIG. 2. Thus, the impact on die size due to the additional circuitry needed for the functional signal at module test pad 34 is minimal. Furthermore, the top-surface area of the module test pad is mostly extended over the passivation layer. Thus the size of the vias is not affected, and the size of the module test pads can be increased without increasing the overall size of the semiconductor device.

Figure 5:
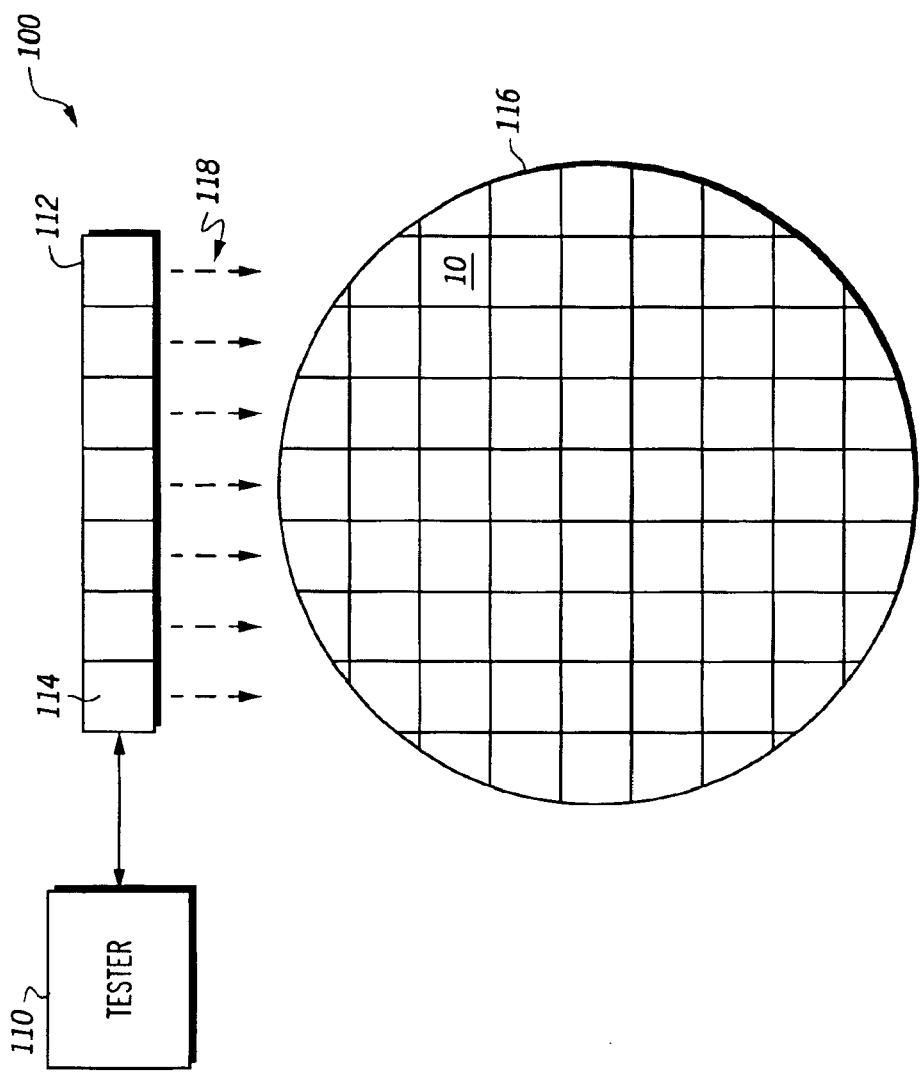
FIG. 5 is a test apparatus useful in testing a plurality of the integrated circuits of FIG. 1 while present on a semiconductor wafer.

Shown in FIG. 5 is a tester 110, a probe 112, a probe segment 114, and a wafer 116 on which semiconductor die 10 resides. In this illustrated embodiment, probe segment 114 has the probe needles necessary to provide connections along a row of die of wafer 116. Wafer 116 rises to mate with probe 112 and provide a physical connection and thereby an electrical connection such that functional signals may pass between tester 110 and the die of wafer 116. Probe 112 is for testing, in parallel, the module of multiple die in a single row which is achieved by relatively long probe needles that can properly contact the die for such test due to the relatively large module test pads present on the die such as semiconductor device 10. Even if the module of all of the die of wafer 116 cannot be tested in parallel, a significant number of them can be. For example, four rows may be tested with four die in each row being reliably contacted on the relatively large module test pads. In such case, 16 die would be tested in parallel.

In the foregoing specification, the invention has been described with reference to specific embodiments. However, one of ordinary skill in the art appreciates that various modifications and changes can be made without departing from the scope of the present invention as set forth in the claims below. For example, there might be another function type other than module that may require extra amounts of time for testing so that bringing oversized test pads for testing the block of that function type would be appropriately brought to the interior of the die. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
   a functional block formed within a die and configured to perform a function;
   a passivation layer overlying a portion of a top surface of the die; and
   a test pad structure for receiving test probes substantially disposed within a center region of the die, wherein the test pad structure includes a first portion not overlying the passivation layer that directly accesses the functional block and a second portion overlying the passivation layer configured for being probed during a testing of the functional block.

2. The integrated circuit of claim 1, further comprising a plurality of bond pads along a periphery of the die; and a via formed through the passivation layer for the first portion of the test pad structure.

3. The integrated circuit of claim 2, wherein the bond pads are configured for at least two sets of signals, a first set of signals disposed for use only with the bond pads on the periphery region, and a second set of signals disposed for use with both the bond pads on the periphery region and the test pad structure, the second set of signals being sufficient to perform a test of the functional block.

4. The integrated circuit of claim 2, wherein the via includes multiple vias, the multiple vias configured per an electrical requirement of the test pad structure.

5. The integrated circuit of claim 2, wherein the test pad structure further includes an aluminum (Al) cap with a barrier layer disposed between the aluminum cap and the passivation layer and functional block.

6. The integrated circuit of claim 2, wherein the test pad structure comprises a plurality of test pads each having a top surface area and the plurality of bond pads each having a top surface substantially smaller than the top surface area of the test pads.

7. The integrated circuit of claim 6 further comprising built-in self-test (BIST)circuitry and wherein the number of test pads sufficient for testing the functional block in conjunction with the BIST circuitry is not greater than 16.

8. The integrated circuit of claim 6, wherein the number of test pads is a function of a desired testing of the functional block.

9. The integrated circuit of claim 6, wherein the test pads are large size on the order of 100 μm×200 μm and of coarse pitch on the order of between 200 to 250 μm.

10. The integrated circuit of claim 6, wherein the test pads are aligned within the center region for probing, wherein the probing includes one selected from the group consisting of cantilevered probing and vertical probing.

11. The integrated circuit of claim 10, further wherein the test pads are aligned in a single row.

12. The integrated circuit of claim 1, wherein the test pad structure includes at least one lest pad configured for use with a signal solely for testing of the functional block.

13. The integrated circuit of claim 12, wherein the testing of the functional block is configured according to one selected from the group consisting of a built in self test (BIST), and a failure analysis test.

14. The integrated circuit of claim 13, further wherein the functional block and the test pad include a memory.

15. The integrated circuit of claim 13, wherein the built in self test (BIST) enables use of a minimum required number of test pads for testing of the functional block.

16. The integrated circuit of claim 12, wherein the signal solely for testing of the functional block is not otherwise required at a bond pad on a periphery region of the die.

17. The integrated circuit of claim 1, wherein the test pad structure is not associated with a next-level interconnection.

18. The integrated circuit of claim 1, wherein the center region represents a core area of the die and excludes bond pads on a periphery region of the die.

19. The integrated circuit of claim 1, wherein the functional block includes a memory.

20. The integrated circuit of claim 19, wherein the memory includes one selected from the group consisting of Flash, DRAM, SRAM, and ROM memory.

21. The integrated circuit of claim 20, further wherein the memory includes Flash memory on the order of 2 megabytes.

22. The integrated circuit of claim 1, wherein the functional block includes a processing unit.

23. The integrated circuit of claim 1, wherein the functional block includes multiple die functionalities of multiple functional blocks.

24. The integrated circuit of claim 1, wherein the functional block includes a portion of a final metal layer.

25. The integrated circuit of claim 24, wherein the final metal layer is one selected from the group consisting of copper and aluminum.

26. An integrated circuit comprising:

a functional block of circuitry formed within a die and configured to perform a function;

a passivation layer overlying a portion of a top surface of the die; and a plurality of bond pads disposed on a periphery region of the die configured for a first set of functions and a second set of functions, wherein the first set of functions is exclusively for the bond pads; and a plurality of test pads overlying a portion of the passivation layer and disposed within a center region of the die, wherein the plurality of test pads are for the second set of functions and wherein the second set of functions is for testing the functional block.

27. The integrated circuit of claim 26, wherein each of the plurality bond pads has a top surface area and each of the plurality of test pads has a top surface area that is at least twice that of each of the plurality of bond pads.

28. The integrated circuit of claim 26, wherein each of the plurality bond pads has a top surface area and each of the plurality of test pads has a top surface area at least about four times that of each of the plurality of bond pads.

29. The integrated circuit of claim 26, wherein tho plurality of test pads are sufficient for testing the functional block.

30. The integrated circuit of claim 26, wherein each of the test pads is directly connected to the functional block through vias in the passivation layer.

31. The integrated circuit of claim 26, wherein each of the test pads is completely surrounded by the passivation layer.

32. A test apparatus for testing the integrated circuit of claim 26, comprising:

a tester for testing the functional block; and a probe card coupled to the tester and having probe contacts, wherein the probe contacts are configured for contacting the test pad structure of the integrated circuit during a test of the functional block by the tester.

33. A method for testing the integrated circuit of claim 26, comprising:

providing a tester for testing the functional block; and supplying a probe card coupled to the tester and having probe contacts, wherein the probe contacts are configured for contacting the test pad structure of the integrated circuit during a test of the functional block by the tester.

34. The method of claim 33, wherein the probe contacts are further configured for contacting test pad structures of a plurality of integrated circuits on a wafer simultaneously for parallel testing, and wherein the tester is further for testing a functional block of the plurality of integrated circuits.

35. The method of claim 34, wherein the probe contacts are configured for contacting the test pad structures of at least sixteen integrated circuit die simultaneously.

36. The method of claim 35, wherein the probe contacts include cantilever probe contacts.

37. A method of making an integrated circuit comprising:

forming a functional block within a die, the functional block of active circuitry configured to perform a function;

forming a passivation layer overlying a portion of a top surface of the die; and forming a teat pad structure substantially overlying a portion of the passivation layer and disposed within a center region of the die, wherein forming the test pad structure includes forming a first portion of the test pad structure that directly accesses the functional block and forming another portion of the test pad structure for being probed during a testing of the functional block.

38. The method of claim 37, further comprising:

forming bond pads disposed on a periphery region of the die, wherein the bond pads are configured for at least two sets of signals, a first set of signals disposed for use only with the bond pads on the periphery region, and a second set of signals disposed for use with both the bond pads on the periphery region and the test pad structure, the second set of signals being sufficient to perform a test of the functional block.

* * * * *

UNITED STATES PATENT AND TRADEMARK OFFICE
CERTIFICATE OF CORRECTION

PATENT NO.        : 6,937,047 B2                                  Page 1 of 1
APPLICATION NO.   : 10/634484
DATED             : August 5, 2003
INVENTOR(S)       : Tu-Anh Tran It is certified that error appears in the above-identified patent and that said Letters Patent is hereby corrected as shown below:

In Column 6, Line 28, Claim No. 9:
　　　Change "100 $\mu$mx200" to --100 $\mu$m x 200--

In Column 6, Line 37, Claim No. 12:
　　　Change "one lest pad" to --one test pad--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO.         : 6,937,047 B2                                      Page 1 of 1
APPLICATION NO. : 10/634484
DATED              : August 30, 2005
INVENTOR(S)        : Tu-Anh Tran It is certified that error appears in the above-identified patent and that said Letters Patent is hereby corrected as shown below:

In Column 6, Line 28, Claim No. 9:
  Change "100 $\mu$mx200" to --100 $\mu$m x 200--

In Column 6, Line 37, Claim No. 12:
  Change "one lest pad" to --one test pad--

This certificate supersedes the Certificate of Correction issued May 20, 2008.

Signed and Sealed this

Seventeenth Day of June, 2008

JON W. DUDAS
*Director of the United States Patent and Trademark Office*